United States Patent
Staempfli

(10) Patent No.: US 12,030,198 B2
(45) Date of Patent: Jul. 9, 2024

(54) METHOD AND AUTOMATED MOTION SYSTEM FOR CONTROLLING A COMPONENT HANDLER

(71) Applicant: ETEL S.A., Motiers (CH)

(72) Inventor: Herve Staempfli, Oye-et-Pallet (FR)

(73) Assignee: ETEL S.A., Motiers (CH)

( * ) Notice: Subject to any disclaimer, the term of this patent is extended or adjusted under 35 U.S.C. 154(b) by 371 days.

(21) Appl. No.: 17/617,599

(22) PCT Filed: Jun. 17, 2020

(86) PCT No.: PCT/EP2020/066731
§ 371 (c)(1),
(2) Date: Dec. 9, 2021

(87) PCT Pub. No.: WO2020/260087
PCT Pub. Date: Dec. 30, 2020

(65) Prior Publication Data
US 2022/0234205 A1     Jul. 28, 2022

(30) Foreign Application Priority Data
Jun. 26, 2019 (EP) .................................... 19182653

(51) Int. Cl.
*B25J 15/00*     (2006.01)
*B25J 9/10*     (2006.01)
(Continued)

(52) U.S. Cl.
CPC ............... *B25J 9/1692* (2013.01); *B25J 9/10* (2013.01); *G01R 19/0092* (2013.01); *B25J 15/0057* (2013.01); *B25J 15/0616* (2013.01)

(58) Field of Classification Search
CPC ................ G01R 19/0092; G01R 15/18; G01R 19/0038; G01R 31/2893; G01R 35/007;
(Continued)

(56) References Cited

U.S. PATENT DOCUMENTS 5,319,353 A * 6/1994 Ohnishi ............. G01R 31/2834
700/83
8,660,635 B2 * 2/2014 Simon .................... G16H 50/50
600/407

(Continued)

FOREIGN PATENT DOCUMENTS

WO    WO 2012002211 A1    1/2012
WO    WO 2014096218 A1    6/2014

OTHER PUBLICATIONS

Liu et al., Design and Characterization of Miniature Auto-Focusing Voice Coil Motor Actuator for Cell Phone Camera Applications, 2009, IEEE, p. 155-159 (Year: 2009).*

(Continued)

*Primary Examiner* — McDieunel Marc
(74) *Attorney, Agent, or Firm* — LEYDIG, VOIT & MAYER, LTD.

(57) ABSTRACT

A method of controlling a component handler includes acquiring and using calibration data. The component handler includes a calibrated actuator comprising a stationary part, a movable part, coil(s), and an actuating member, and a component holder comprising a distal end and an elastic member. The component holder is actuable from a resting to an extended position by the actuating member and in reverse by the elastic member. The calibration data is acquired by: bringing the actuating member into contact with an actuable portion of the component holder, moving the component holder in a position within the resting and extended position, measuring a required current in the coil(s) to maintain or move the component holder in the position, and determining the calibration data from the current, which is used to control the actuator such that the distal end applies a predetermined force on the component in a pick-up position.

11 Claims, 3 Drawing Sheets

(51) Int. Cl.
*B25J 9/16* (2006.01)
*G01R 19/00* (2006.01)
*B25J 15/06* (2006.01)

(58) Field of Classification Search
CPC ............ G01R 31/2868; G01R 31/2867; G01R 31/2865; B25J 9/1692; B25J 9/10; B25J 15/0616; B25J 15/0057
See application file for complete search history.

(56) References Cited

U.S. PATENT DOCUMENTS

| | | | |
|---|---|---|---|
| 9,193,015 B2 | 11/2015 | Van De Rijdt | |
| 11,604,019 B2* | 3/2023 | Alfano | F25B 45/00 |
| 2002/0116090 A1 | 8/2002 | Fischer | |
| 2008/0134748 A1 | 6/2008 | Hay et al. | |
| 2012/0229048 A1* | 9/2012 | Archer | H05B 47/155 |
| | | | 315/307 |
| 2014/0212246 A1 | 7/2014 | Lee | |
| 2015/0233793 A1 | 8/2015 | Roy et al. | |
| 2015/0362207 A1* | 12/2015 | Abiprojo | F24F 11/67 |
| | | | 702/183 |
| 2019/0154287 A1* | 5/2019 | Pham | F24F 11/0008 |
| 2020/0062010 A1* | 2/2020 | Donaldson | B41J 11/008 |
| 2021/0041119 A1* | 2/2021 | Pham | F24F 3/14 |

OTHER PUBLICATIONS

Morrow et al., Improving Soft Pneumatic Actuator fingers through integration of soft sensors, position and force control, and rigid fingernails, 2016, IEEE, pg. (Year: 2016).*
Krouglicof et al., Development of a novel PCB-based voice coil actuator for opto-mechatronic applications, 2013, IEEE, p. 5834-5840 (Year: 2013).*
Chu et al., Design and control of a multifunction myoelectric hand with new adaptive grasping and self-locking mechanisms, 2008, IEEE, p. 743-748 (Year: 2008).*
John W.L Simpson, et al., "Sensorless Force Estimation for Robots with Friction," Australian Robotics and Automation Association, Nov. 27-29, 2002, pp. 94-99, Auckland, New Zealand.

* cited by examiner

METHOD AND AUTOMATED MOTION SYSTEM FOR CONTROLLING A COMPONENT HANDLER

CROSS REFERENCE TO RELATED APPLICATIONS

This application is a U.S. National Phase application under 35 U.S.C. § 371 of International Application No. PCT/EP2020/066731, filed on Jun. 17, 2020, and claims benefit to European Patent Application No. EP 19182653.6, filed on Jun. 26, 2019. The International Application was published in English on Dec. 30, 2020 as WO 2020/260087 A1 under PCT Article 21(2).

FIELD

The present invention relates to a method of controlling a component handler of an automated motion system for applying constant and repetitive forces of an optimal value on components, such as electronic components, to be handled. Optimal force control ensures the handling of components at high speed without any damage to the components, and allows performing different processes, such as bonding processes, where precise force control is essential. The invention also relates to an automated motion system adapted to perform the method thereof.

BACKGROUND

Automated motion systems, for example of the type of turret handlers, comprise a stationary support on which actuators are mounted and a carousel (turret) rotatably mounted relative to the stationary support. Components are loaded on the carousel and indexed at high speed to individual test stations.

Handling components at high speed raises proportionally the challenge of handling carefully the components. Turret handlers are equipped with multiple component handlers. Each component handler comprises a vertical actuator and a component holder in the form of a pipet. The pipet comprises a tube slidably mounted through a plain bearing, a compression spring arranged around the tube, and a vacuum pick-up nozzle at a distal end of the tube for components handling.

Because of the nature of the components to be handled, such as electronic components, which have become over the years considerably thinner, and which may be made of brittle materials, force control has become extremely important to avoid breaking or even marking the components, or to perform some operations.

However, the friction occurring between the plain bearing and the pipet and the spring stiffness under operating conditions may change over time, so that a same force or displacement applied by an actuator to the pipet may result in varying force or displacement of the distal end of the pipet. Regular recalibration using a force sensor is therefore necessary for force control, which is a cumbersome and costly procedure.

In robotic systems, servo motor position and torque information, deduced from motor currents, have been used to calculate and control forces at a robot's end effector. Simpson et al. ["Sensorless Force Estimation for Robots with Friction", Proc. 2002 Australasian Conference on Robotics and Automation, Auckland, 27-29 Nov. 2002] have proposed a method for estimating forces applied at the end effector of a Selective Compliance Assembly Robot (SCARA robot) using force estimation models based in particular on inertia and coulomb frictions parameters to address the problem of frictions and other torques the motor's torque must overcome.

The estimation models used in the work presented in the above reference are adapted for SCARA robots which differ significantly from automated motions systems for electronic components handling in terms of parameters having an influence on the desired force to be applied on the electronic components.

US 2014/0212246 discloses an apparatus for picking and placing or picking and transferring or for picking, placing and pressing semiconductor components to and from a workstation. The apparatus comprises a rotatable turret holding a plurality of pressers. Each of these pressers is a voice coil assembly. The apparatus further comprises a pre-calibrated linear encoder which provides a linear relationship between the pressing force and the current flowing on the voice coil.

One disadvantage of using linear encoder stems from the fact that they are usually expensive.

SUMMARY

In an embodiment, the present disclosure provides a method of controlling a component handler of an automated motion system, for picking up a component from a pick-up position. The method includes acquiring and using calibration data. The component handler includes a calibrated actuator comprising a stationary part, a movable part, one or more coils, a permanent magnet and an actuating member, and a component holder comprising a distal end and an elastic member. The component holder is arranged to be actuated from a resting position to an extended position by the actuating member of the actuator and from the extended position to the resting position by the elastic member. The calibration data is acquired by: bringing the actuating member into contact with an actuable portion of the component holder, moving the component holder in at least one position within the resting and extended position, measuring a required current in the one or more coils to maintain or move the component holder in the at least one position, and determining the calibration data from the current. The calibration data is used to control the actuator for moving the component holder such that the distal end applies a predetermined force on the component in the pick-up position.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
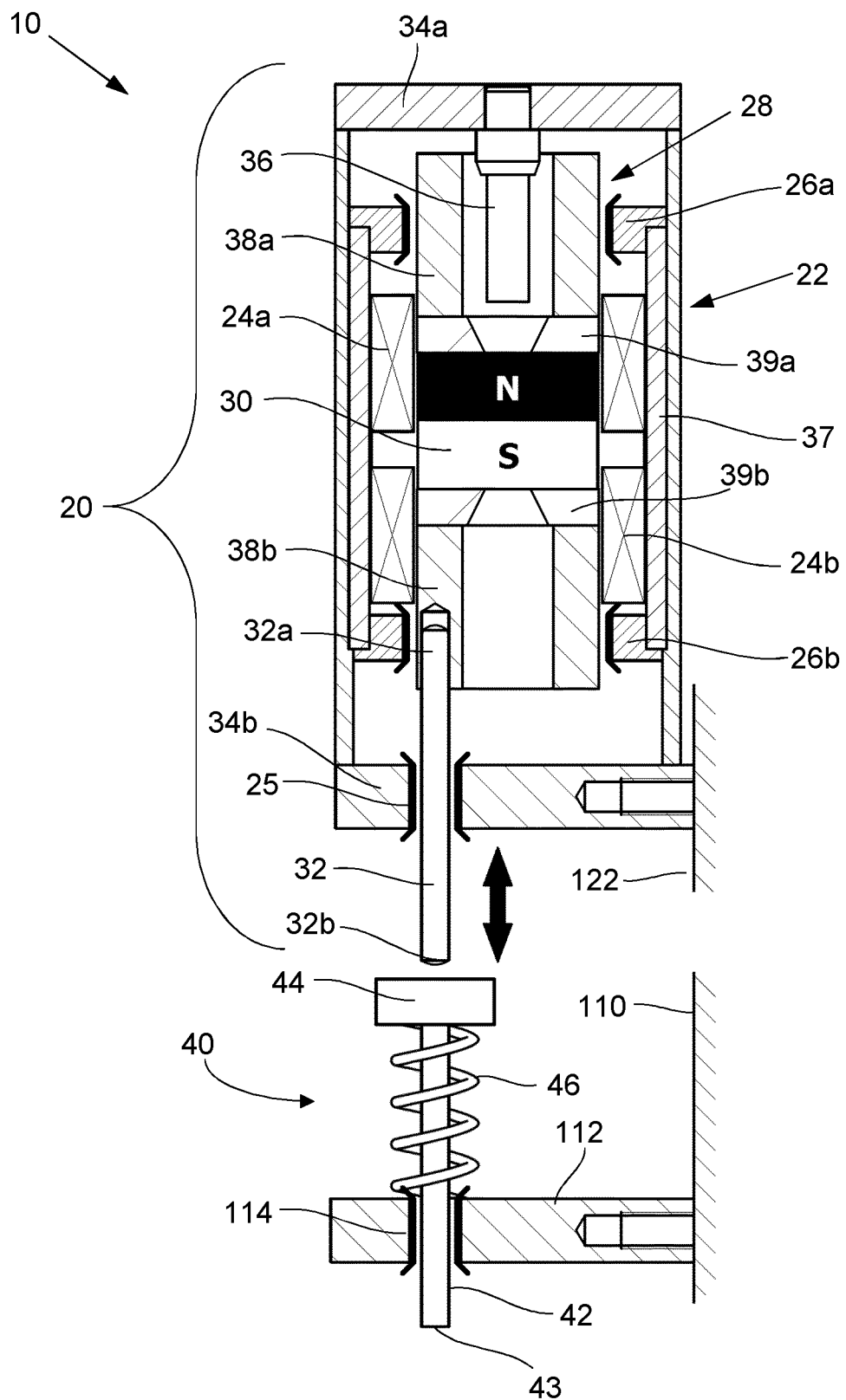
FIG. 1 shows a cross-sectional view of a component handler comprising an actuator and a component holder according to an embodiment of the present invention.

Embodiments of the present invention provide for a number of improvements and advantages including providing: a method of controlling a component handler of an automated motion system capable of applying constant and repetitive forces of an optimal value on a component without any force sensor; an automated motion system with advanced soft-contacting component handlers; an automated motion system which is cost-effective; and/or a computer program for controlling the automated motion system.

These improvements and advantages are achieved by a method of controlling a component handler of an automated motion system, for picking up a component from a pick-up position, according to an embodiment of the present invention. The component handler comprises a calibrated actuator and a component holder. The actuator comprises a stationary part, a movable part, one or more coils, a permanent magnet, and an actuating member. The component holder comprises a distal end and an elastic member. The component holder is arranged to be actuated from a resting position to an extended position by the actuating member of the actuator and from the extended position to the resting position by the elastic member. The method comprises:
  a) acquiring calibration data of the component holder by:
    operating the actuator to move said actuating member into contact with an actuable portion of the component holder,
    moving the component holder in at least one position within said resting and extended position, and
    measuring the required current in said one or more coils to maintain or move the component holder in said at least one position, and
    determining said calibration data from said current,
  b) using said calibration data to control the actuator for moving the component holder such that its distal end applies a predetermined force on the component in the pick-up position.

In an embodiment, the step of acquiring calibration data comprises:
  a1) measuring the required currents in said one or more coils to maintain the component holder in at least two distinct positions within said resting and extended position,
  a2) determining the force applied on the actuable portion of the component holder by the actuating member at each of the at least two distinct positions according to said required currents and the force constant of the actuator in said at least two distinct positions, and
  a3) determining calibration data based on the force applied by the actuating member on said actuable portion of the component holder at each of said at least two distinct positions.

In an embodiment, the calibrated actuator further comprising one or more bearings mounted around the movable part, and an actuating member bearing through which the actuating member passes, wherein the force applied on the actuable portion of the component holder under step b) is determined by further taking into consideration friction coefficient of said one or more bearings and of the actuating member bearing.

In an embodiment, the calibrated actuator further comprises a gravity compensator. The force applied on the actuable portion of the component holder under step b) is determined by further taking into consideration the force generated by the gravity compensator in said at least two distinct positions.

In an embodiment, step a) comprises:
  i) measuring the required currents in said one or more coils to maintain the component holder in multiple distinct positions within said resting and extended position, and
  ii) moving the component holder at constant speed within said resting and extended position and measuring again the required currents in said one or more coils in said multiple distinct positions when the component holder is moving past each distinct position.

In an embodiment, steps i) and ii) are preformed when the component holder is moved downwardly and upwardly.

In an embodiment, the component holder comprises a tube connected to vacuum means. The actuator is controlled to move the distal end of the tube at constant speed to a position above a suction surface, whereupon the speed is decreased such that said distal end is at or near a standstill as soon it reaches the suction surface.

Another embodiment of the invention provides an automated motion system having a computer comprising a processor and a memory with a computer program stored thereon and for storing calibration data. The computer program comprises instructions to cause, when executed by the processor, the automated motion system to perform the method according to any embodiment of the present invention.

In an embodiment, the automated motion system is a turret handler.

Another embodiment of the invention relates to a computer-readable medium having stored thereon a computer program comprising instructions to cause the automated motion system to perform the method according to any embodiment of the present invention.

Another embodiment of the invention relates to a method of monitoring an automated motion system to detect any actuator that has drifted over time and lost its accuracy. The automated motion system comprises multiple actuators and at least one component holder. Each actuator comprises a stationary part, a movable part, one or more coils, a permanent magnet and an actuating member. The component holder comprises a distal end and an elastic member supported by a mounting base of the automated motion system movable relative to said multiple actuators. The method comprises:
  a) controlling one of said multiple actuators for moving the component holder such that its distal end applies a predetermined force on a given surface,
  b) measuring the required current in said one or more coils to apply said predetermined force on the surface,
  c) moving the mounting base to align the component holder successively with each other actuator of said multiple actuators and repeating step a) and b) for each other actuator, wherein the distal end of the component holder applies a predetermined force on a corresponding given surface,
  d) comparing said required current between the multiple actuators, and
  e) determining whether any actuator has drifted over time and lost its accuracy based on any discrepancy in the measured currents for all actuators.

Figure 2:
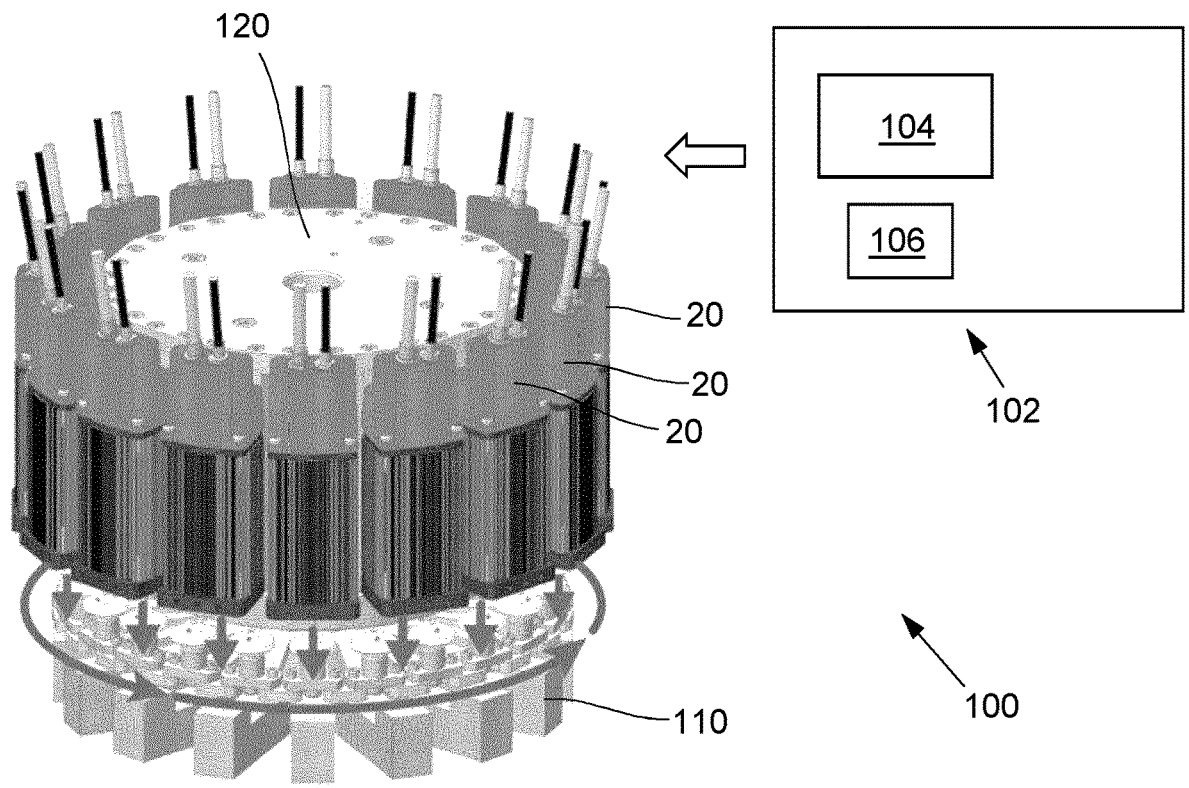
FIG. 2 shows a perspective view of a turret test handler comprising a computer for controlling the component handler of FIG. 1 according to an embodiment of the present invention.

FIG. 1 illustrates an exemplary embodiment of a component handler 10 for an automated motion system such as for example a turret handler 100 as shown in FIG. 2. The structural and functional parts of the component handler 10 will first be described with reference to FIG. 1 as to understand the different parameters which need to be taken into consideration for calibration in order to provide a component handler 10 capable of applying constant and repetitive force of a desired value on electronic components.

The component handler 10 comprises a vertical actuator 20 and a component holder 40. The actuator 20 comprises a stationary housing 22 and a movable part 28 slidably mounted inside the stationary housing 22 along an axial direction. An upper and a lower portion 24a, 24b of a coil are mounted around the movable part 28 and are fixed to a cylindrical yoke 37, made of magnetic material, which is bonded against the inner walls of the stationary housing 22.

The movable part 28 comprises upper and lower cylindrical guiding parts 38a, 38b, made for example of stainless steel, and arranged on both sides of a permanent magnet 30. The upper and lower cylindrical guiding parts 38a, 38b are slidably mounted against a first and a second bearing 26a, 26b, which are fixed respectively to the upper and lower parts of the stationary housing 22 of the actuator 20. Upper and lower ferromagnetic rings 39a, 39b are mounted against two opposite sides of the permanent magnet 30 and between the magnet 30 and the upper and lower cylindrical guiding parts 38a, 38b respectively.

The lower cylindrical guiding part 38b comprises a bore receiving a proximal end 32a of an actuating member 32 which may be for example in form of a rod. The lower part 34b of the stationary housing 22 comprises an actuating member bearing 25 through which the actuating member 32 passes. The upper part 34c of the stationary housing 22 is made of non-magnetic material. An upper magnetic part 36, which may be for example in the form of a magnetic pin, is connected to the non-magnetic upper part 34 such that the central axis of the magnetic pin 36 coincides with the central axis of the movable part. The magnetic pin 36 is magnetically isolated from the magnet yoke 37 since the non-magnetic upper part 34 separates the magnetic pin 36 and the magnet yoke 37 from each other.

The upper portion 24a of the coil is wound in a first direction while the lower portion 24b of the coil is wound in a second direction, opposite the first direction. The coil therefore defines a single-phase actuator which, however, is disposed such that the magnetic field generated by the lower portion 24a has a direction which is opposite to the direction of the magnetic field generated by the upper portion 24a of the coil.

The movable part 28 of the vertical actuator 20 as described above remains in a position of stable equilibrium, upon absence of a current supply, which corresponds to a high or upper position of the movable part 28. This position depends on the resultant of forces applied over the entire functional range of the actuator, such that in response to the absence of a current supply, the movable part is able to reach the position of stable equilibrium from any position of the functional range provided. An upward resultant force is produced by the arrangement of the magnetic pin 36, and the upper ferromagnetic ring 39a of the movable part 28, which act together as a gravity compensator.

Still referring to FIG. 1, the component holder 40 of the component handler 10 is configured to be mounted on a mounting base 112 of a carrousel 110 of the automated motion system as described subsequently. The component holder 40 comprise a tube 42 passing through a bearing 114 mounted on the mounting base 112, and an actuable part 44 configured to be actuated downwardly by the distal end 32b of the actuating member 23 of the actuator 20. The tube 42 is connected to vacuum means for lifting off electronic components by suction.

An elastic member, which is preferably in the form of a compression spring 46, is arranged around the tube 42. The opposite ends of the compression spring 46 rest respectively against the mounting base 112 and the lower portion of the actuable part 44 of the component holder. The distal end 43 of the tube 42 is configured to be brought in a predetermined axial position to come into contact with an electronic component with an optimal force without risking damaging such component.

It is therefore important that the component handler 10 is capable of applying constant repetitive force of a desired value on the components. Constant repetitive force is however difficult to achieve as the automated motion system 100 as shown in FIG. 2 comprises multiple component handlers 10 and the desired value of the force to be applied on electronic components are dependent upon several parameters of the component handler 10 which may vary significantly from one component handler to another, and over time. It is therefore provided thereafter a method of controlling a component handler of an automated motion system, for applying in a repetitive manner a constant predetermined force on a component in a pick-up position.

The automated system of FIG. 2 comprises a stationary actuator support 120 and a carousel 110 rotatably mounted relative to the stationary actuator support 120. The automated motion system 100 comprises multiple component handlers 10. Each component handler 10 is configured to load components, such as resistors, diode, capacitor, simple ICs or wafer dies, to different stations, for example bonding station, test station, visual inspection station and/or laser marking station. Each actuator 20 and the corresponding component holder 40 of each component handler 10 are mounted respectively on the stationary actuator support 120 and the carousel 110.

The automated motion system 100 with the actuators 20 of the component handlers 10 is provided by the manufacturer of the system while the component holders 40 may be provided by users of the system. The actuators 20 are calibrated in the course of quality control stages of the automated motion system.

In order to achieve constant repetitive force of a desired value on electronic components, a number of parameters must be taken into account both at the actuator level and at the component holder level. At the actuator level, at least the following parameters must be taken into consideration: the force constant ($K_t$) variation of the motor, the force of friction $F_f$ of the first and second bearings 26a, 26b and of the actuating member bearing 25, and the force $F_g$ generated by the gravity compensator.

In a variant, the first and second bearings and the actuating member bearing may advantageously be replaced by spring blades which have the advantage that their stiffness and (very low) friction change very little with temperature and time. The force versus position curve of the spring blades must however be measured for every actuator to determine the spring constant of the spring blades.

At the component holder level, at least the following parameters must be taken into consideration: the force constant (K) of the spring 46, and the frictions of the bearing 114.

The actuator 20 offers a typical ±10 to ±20% force constant (Kt) variation by design. The impact on the force applied to the component for a given level of current is varying accordingly. Therefore, the determination of the constant Kt of each actuator requires a calibration. This can be performed during production using a force sensor. The change in force due to temperature (around 0.11% per Kelvin for NdB rare-earth magnets) can also be taken into account if needed. The actuator calibration data may be stored either in a memory on the actuator itself or in a computer that controls the system. As will be described later, the actuator may be recalibrated after production, based on measurements with calibrated component holders.

Figure 3:
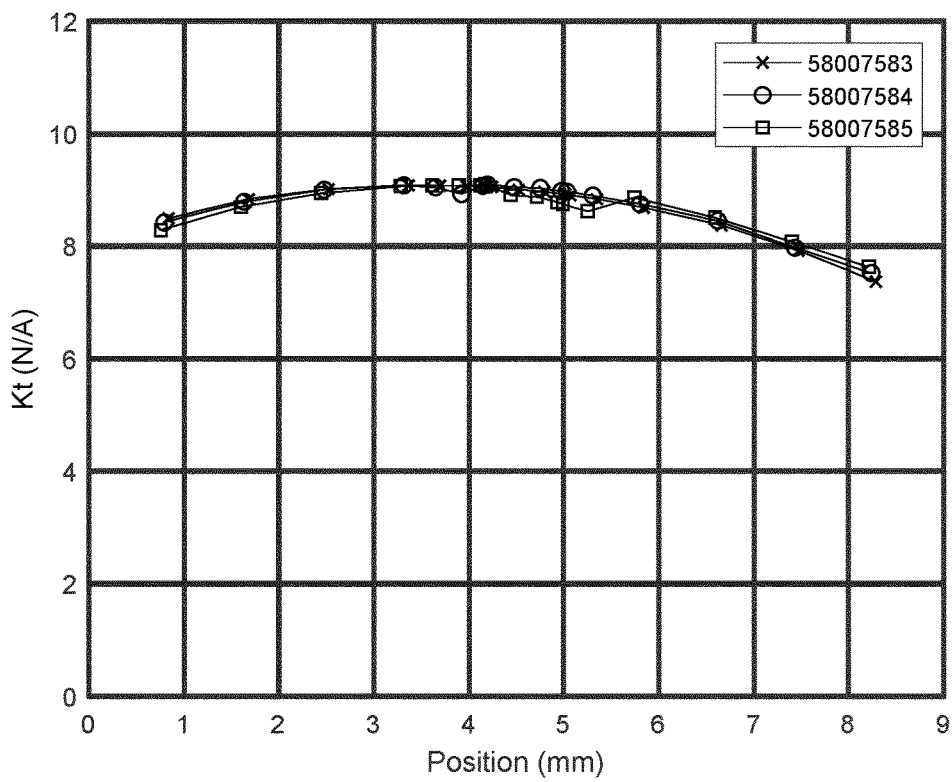
FIG. 3 is a graph illustrating an example of a Kt calibration as a function of the position of the actuating member of the actuator.

FIG. 3 illustrates an example of a Kt calibration as a function of the position of the actuating member of the actuator on the assumption that the force generated by the frictions of the bearings is known and constant.

Since the actuator is calibrated, it can be used for determining the calibration data of a component holder 40 mounted onto that actuator. More specifically, the force to be applied by the actuator to move or maintain the distal end of the component holder 40 to/at a given position depends on the known, calibrated parameters of the actuator, and on the unknown parameters of the component holder; since the parameters of the actuator are known, the force applied by the actuator to reach or maintain a given position can be used for determining the calibration data of the component holder.

The component holder calibration data may be acquired through a process comprising different displacements of the component holder, in one or two senses. For example, the actuator 20 may be controlled to bring the component holder to different positions $x_i$ and populate a Table 1 as shown below.

TABLE 1

| Direction | Position x | Speed [mm/s] | Force | Speed [mm/s] | Force |
|---|---|---|---|---|---|
| Down | 0 | 0 | 6.23 | 20 | 8.04 |
| Down | 1 | 0 | 7.20 | 20 | 9.00 |
| Down | 2 | 0 | 8.03 | 20 | 9.92 |
| Down | 3 | 0 | 9.53 | 20 | 10.57 |
| Down | 4 | 0 | 10.56 | 20 | 12.07 |
| Down | 5 | 0 | 11.45 | 20 | 12.65 |
| Down | 6 | 0 | 11.82 | 20 | 13.33 |
| Down | 7 | 0 | 13.62 | 20 | 14.56 |
| Down | 8 | 0 | 14.15 | 20 | 15.73 |
| Down | 9 | 0 | 15.34 | 20 | 16.99 |
| Down | 10 | 0 | 15.83 | 20 | 17.98 |
| Up | 10 | 0 | 14.13 | 20 | 12.40 |
| Up | 9 | 0 | 13.73 | 20 | 12.31 |
| Up | 8 | 0 | 12.48 | 20 | 11.16 |
| Up | 7 | 0 | 11.48 | 20 | 9.89 |
| Up | 6 | 0 | 9.89 | 20 | 8.58 |
| Up | 5 | 0 | 9.58 | 20 | 7.50 |
| Up | 4 | 0 | 7.80 | 20 | 7.13 |
| Up | 3 | 0 | 6.86 | 20 | 5.65 |
| Up | 2 | 0 | 6.26 | 20 | 5.31 |
| Up | 1 | 0 | 5.05 | 20 | 3.71 |
| Up | 0 | 0 | 4.08 | 20 | 2.89 |

The actuator 20 of FIG. 1 is first controlled to move the distal end 32b of the actuating member 32 into contact with the actuable portion 44 of the component holder 40 in an initial position x corresponding to position 0 mm in the above table. The required current (Loll) in the upper and lower portion 24a, 24b of the coil of the actuator 20 to maintain the distal end of the actuating member in this position is measured. The actuator 20 is then controlled to move the component holder 40 in several position within a resting position and an extended position. To that end, the distal end 32b of the actuating member 32 is moved downwardly in several positions within its entire stroke, for example in ten distinct positions with an interval of 1 mm from each other, and the required currents $I_{coil}$ in the coil of the actuator to maintain or bring the distal end 32b of the actuating member 32 in each of these positions $x_i$ are measured and used to determine the force applied by the actuator at each position.

The actuator 20 is then controlled to move upwardly the distal end 32b of the actuating member 32 in the same distinct positions and the required currents in the coil of the actuator 20 to maintain or bring the distal end 32b of the actuating member 32 in each of these positions are measured again.

The actuator is then controlled to move the distal end of the actuating member downwardly and upwardly at constant speed, for example at 20 mm/s, and the currents in the coil are measured while the distal end of the actuating member passes each of the same distinct positions at constant speed.

Figure 5:
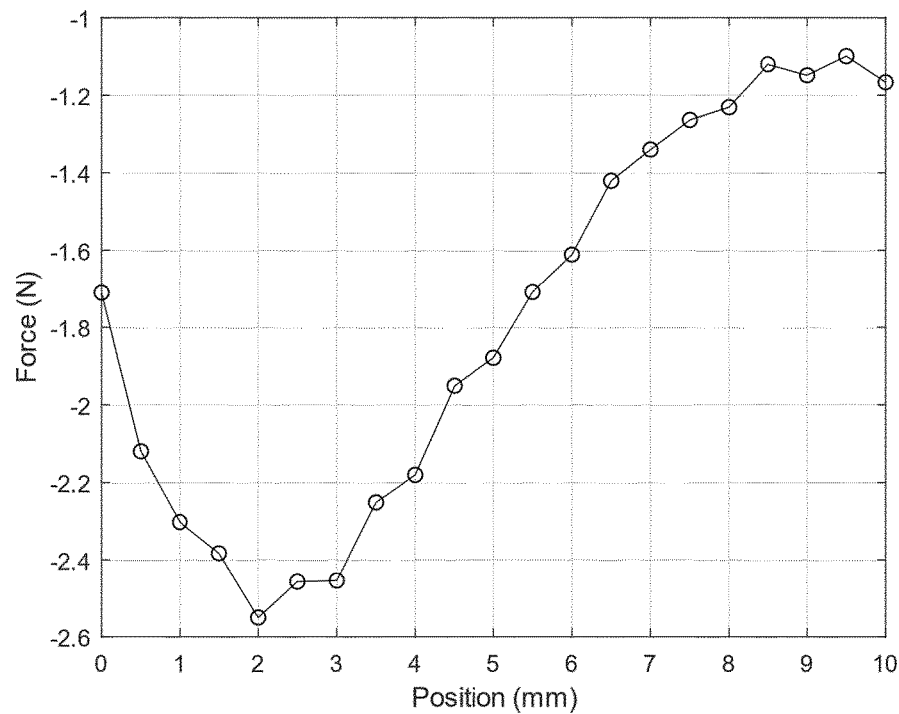
FIG. 5 is a graph representing the force generated by the gravity compensator of the actuator as a function of the position of the distal end of the actuating member of the actuator.

For each position x, the force generated by the actuator is obtained by the equation:

$$F_{em} = K_t I_{coil} \qquad \text{i)}$$

where the force constant Kt of the actuator for each position x is known and calibrated as shown in FIG. 3. The force applied by the distal end of the actuating member on the actuable part 44 of the component holder 40 is obtained by the equation:

$$F_{act} = -F_{em} - F_b + F_g \qquad \text{ii)}$$

where $F_b$ is the friction forces of the first and second bearings 26a, 26b and the actuating member bearing 25 of the actuator 20 of FIG. 1, which are known, or the recoiling force depending on the spring constant of the spring blades that depends on position if all the bearings of the actuator are replaced by spring blades, and $F_g$ is the force generated by the gravity compensator of the actuator which has been measured for each distinct position with an interval of 1 mm from each other as shown in FIG. 5. Equations i) and ii) have been used to populate the above table.

Figure 4:
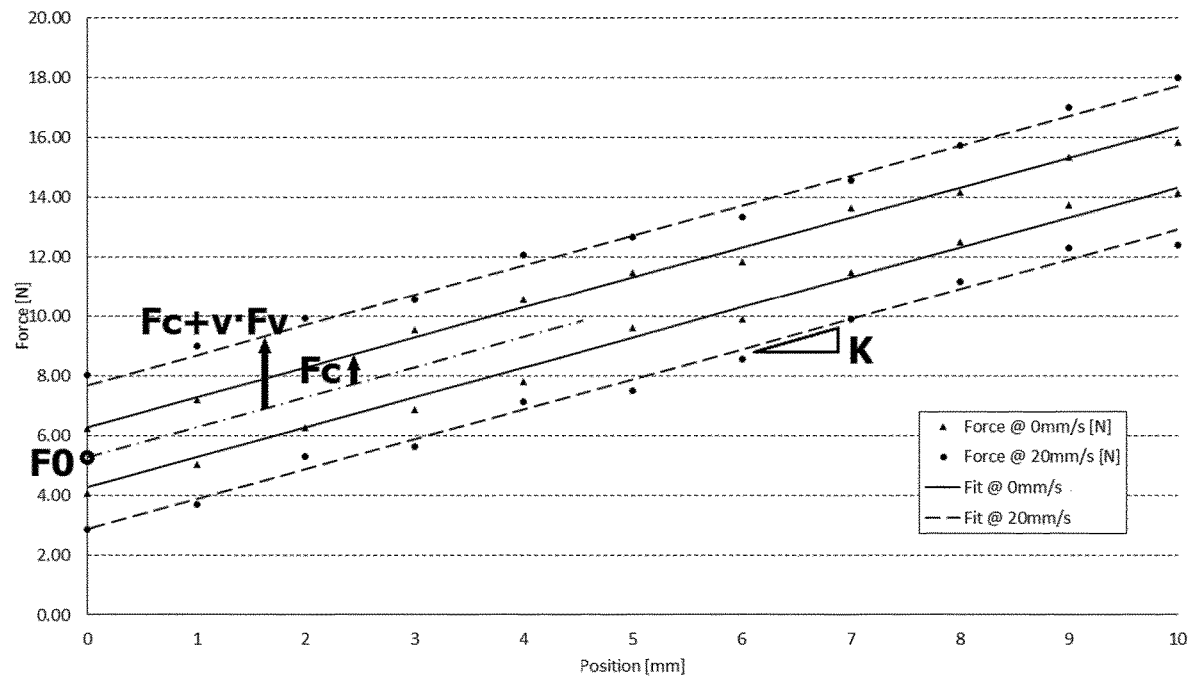
FIG. 4 is a graph derived from calibration data based on a force estimation model.

FIG. 4 shows a graph representing the above calibration data. Four parameters of the component holder 10 may be determined using a non-linear least-squares fitting algorithm, whereby:

the slope of the linear regression provides the spring constant K, the initial force $F_0$ is found at position 0 in the intersection of the linear regression with the Y-axis, and the dry and viscous friction coefficients $F_c$ and $F_v$ are obtained by the vertical offset between the average of the linear regression of the force $F_{act}$ in multiple distinct positions calculated during both downward and upward movements of the actuating member when the distal end of the actuating member is at a standstill in each distinct position (linear regression intersecting the Y-axis) and the linear regression of the force $F_{act}$ in multiple distinct positions when the actuating is moving at constant speed.

Using the calibration data of the component holder 40, the four parameters $F_0$, $F_c$, $F_v$ and K can be calculated for each component handler 10 of the automated motion system.

In order to apply on electronic components a force F of an optimal value by the distal end 43 of the tube 42 for an operation performed at a standstill, for example a bonding process requiring 1N of vertical force, the automated motion system 100 as shown in FIG. 2 comprises a computer 102 having a processor 104 and a memory 106 storing a computer program comprising instructions which, when the program is executed by the processor 104, cause the computer to carry out following operations:

calculating the friction force $F_f$ or recoiling force of the component holder using the equation: $F_f = F_c$ calculating the force that must be applied by the distal end of the actuating member 32 of the actuator on the actuable part 44 of the component holder 40 using the following equation:

$$F_{act} = F + F_0 + K \cdot x + F_f$$

where x is the distance between the initial position 0 and the new position of the distal end of the actuating member, add to this force $F_{act}$ the bearing force and substract the gravity compensator force $F_g$ to calculate the generated force by the actuator using the equation:

$$F_{em} = F_{act} + F_b - F_g$$

calculating the required current using the equation: $I_{coil} = F_{em}/K_t$ where $K_t$ is the force constant of the actuator when the distal end of the actuating member is at position x, and moving the distal end of the actuating member of the actuator in position x and adjusting the current $I_{coil}$ to apply on the component the optimal force F by the distal end 43 of the tube 42 of the component holder 10.

It should be noted that it is also possible to interpolate between data points in order to determine directly the current $I_{coil}$ to be applied to the actuator in order to bring the distal end of the component holder 40 at an intermediate position between two positions $x_1$, $x_2$; the current required to reach or maintain those intermediate positions can thus be determined without computing the four parameters $F_0$, $F_c$, $F_v$ and K.

For processes performed during a vertical movement of the component handler, the equation under step i) must be replaced by the equation $F_f = F_c + F_v$ in order to take into account the viscous friction coefficient.

The computer program for carrying out the above operation contains instructions to control the actuator 20 to move the distal end 43 of the tube 42 at constant speed to a position above a suction surface, whereupon the speed is decreased to ensure that the force applied by the distal end 43 on the component does not exceed a predetermined force as soon it reaches the suction surface. An automated motion system with advanced soft-contacting component handlers is therefore obtained.

In another embodiment, there is provided a monitoring method of an automated motion system, for example of the type of a turret test handler, to identify whether any actuator has drifted over time and lost its accuracy using a component handler 40 as a reference standard.

The turret handler 100 as shown in FIG. 2 comprises multiple actuators 20. Calibrated actuators tend to drift over time and should therefore be recalibrated on a regular basis. Monitoring the actuators regularly to detect as soon as possible inaccurate actuator is essential in order to avoid a drift in the force applied on components in their pick-up position by the component handlers.

The method consists in placing a component holder 40 in the mounting base 112 of the carousel 110 of the turret handler 100 such that it is aligned with one of multiple actuators 20 connected to the mounting part 122 of the stationary actuator support 120. The actuator 20 is then controlled to move the component holder 40 such that its distal end 43 applies a predetermined force on a surface disposed in a given position.

The required current $I_{coil}$ in the coils 24a, 24b of the actuator 20 to apply the predetermined force on the surface is then measured. The carousel 110 of the turret handler 100 is then rotated to align the component holder 40 successively with each other actuator 20 and required current in the coils 24a, 24b of the actuator 20 to apply the predetermined force on a corresponding surface in a corresponding given position is measured again for each actuator. Each corresponding surface aligned with each actuator to be tested are positioned together at the same height.

The current measured for each actuator is then compared with the other actuators and any actuator that has drifted over time and lost its accuracy is identified, if any, based on possible discrepancies between the measured currents.

Although the method of controlling a component handler of an automated motion system as described above is disclosed with an actuator designed such that the permanent magnet is movable relative to a stationary housing comprising coils, the method may also be applied to any linear actuator comprising a stationary cylindrical permanent magnet and a coil movably mounted inside the cylindrical permanent magnet.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE LIST

Automated motion system 100
Computer 102
Processor 104
Memory 106
Carousel 110
Mounting base 112
Bearing 114
Stationary actuator support 120
Mounting part 122
Component handler 10
Actuator 20
Stationary housing 22
Coil
First and second portions 24a, 24b
Movable part guiding members First and second bearings 26a, 26b
Actuator lower part 34b
Actuating member bearing 25
Movable part 28
Permanent magnet 30
Actuating member 32
Proximal end 32a
Proximal end 32b
Rod
Gravity compensator
Actuator upper part 34a
Upper magnetic part 36
Metal pin
Cylindrical yoke 37
Cylindrical guiding parts 38a, 38b
Upper and lower magnetic rings 39a, 39b
Component holder 40
Tube 42
Distal end 43
Actuable part 44
Elastic member 46
Compression spring

The invention claimed is:

1. A method of controlling a component handler of an automated motion system, for picking up a component from a pick-up position, the component handler comprising a calibrated actuator comprising a stationary part, a movable part, one or more coils, a permanent magnet and an actuating member, and a component holder comprising a distal end and an elastic member, wherein the component holder is arranged to be actuated from a resting position to an extended position by the actuating member of the actuator and from the extended position to the resting position by the elastic member, the method comprising:
  a) acquiring, by a processor, calibration data of the component holder by:
    bringing the actuating member into contact with an actuable portion of the component holder,
    moving the component holder in at least one position within the resting and extended position,
    measuring, using the processor or another processor, a required current in the one or more coils to maintain or move the component holder in the at least one position, and
    determining, by the processor or another processor, the calibration data from the current; and
  b) using the calibration data to control the actuator for moving the component holder such that the distal end applies a predetermined force on the component in the pick-up position.

2. The method of claim 1, wherein the step of acquiring the calibration data comprises:
  a1) measuring required currents in the one or more coils to maintain the component holder in at least two distinct positions within the resting and extended position,
  a2) determining the force applied on the actuable portion of the component holder by the actuating member at each of the at least two distinct positions according to the required currents and a force constant of the actuator in the at least two distinct positions, and
  a3) determining calibration data based on the force applied by the actuating member on the actuable portion of the component holder at each of the at least two distinct positions.

3. The method of claim 2, the calibrated actuator further comprising one or more bearings mounted around the movable part, and an actuating member bearing through which the actuating member passes, wherein the force applied on the actuable portion of the component holder under step b) is determined by further taking into consideration a friction coefficient of the one or more bearings and of the actuating member bearing.

4. The method of claim 2, the calibrated actuator further comprising a gravity compensator, wherein the force applied on the actuable portion of the component holder is determined by further taking into consideration a force generated by the gravity compensator.

5. The method of claim 2, wherein the step of acquiring the calibration data comprises:
  i) measuring required currents in the one or more coils to maintain the component holder in multiple distinct positions within the resting and extended position, and
  ii) moving the component holder at constant speed within the resting and extended position and measuring the required currents in the one or more coils in the multiple distinct positions when the component holder is moving past each of distinct position.

6. The method of claim 5, wherein steps i) and ii) are performed when the component holder is moved downwardly and upwardly.

7. The method of claim 1, the component holder further comprising a tube connected to a vacuum source, wherein the actuator is controlled to move the distal end of the tube at constant speed to a position above a suction surface, whereupon a speed is decreased to ensure that the force applied by the distal end as soon it reaches the suction surface does not exceed the predetermined force.

8. An automated motion system for determining and storing calibration data, the automated motion system comprising a computer comprising a processor and a memory with a computer program stored thereon comprising instructions to cause, when executed by the processor, the automated motion system to perform the method of claim 1.

9. The automated motion system of claim 8, in the form of a turret handler.

10. A tangible, non-transitory computer-readable medium having stored thereon a computer program comprising instructions to cause an automated motion system comprising one or more processors to perform the method of claim 1.

11. A method of monitoring an automated motion system to detect an actuator that has drifted over time and lost accuracy, the automated motion system comprising a plurality of actuators, each comprising a stationary part, a movable part, one or more coils, a permanent magnet and an actuating member, and at least one component holder comprising a distal end and an elastic member supported by a mounting base of the automated motion system movable relative to the actuators, the method comprising:
  a) controlling, by a processor, one of the actuators for moving the component holder such that the distal end applies a predetermined force on a calibration surface disposed in a given position,
  b) measuring, using the processor or another processor, a required current in the one or more coils to apply the predetermined force on the calibration surface,
  c) moving the mounting base to align the component holder successively with each of the other actuators of the actuators and repeating steps a) and b) for each of the other actuators, wherein the distal end of the component holder applies a predetermined force on a corresponding given surface, d) comparing, by the processor or another processor, the required current between the multiple actuators, and
e) determining, by the processor or another processor, whether any of the actuators has drifted over time and lost accuracy based on a discrepancy in the measured currents for all of the actuators.

\* \* \* \* \*